(12) United States Patent
Manfrini et al.

(10) Patent No.: US 12,453,076 B2
(45) Date of Patent: Oct. 21, 2025

(54) HIGH-DENSITY 3D-DRAM CELL WITH SCALED CAPACITORS

(71) Applicant: Taiwan Semiconductor Manufacturing Company, Ltd., Hsin-Chu (TW)

(72) Inventors: Mauricio Manfrini, Zhubei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 731 days.

(21) Appl. No.: 17/751,937

(22) Filed: May 24, 2022

(65) Prior Publication Data

US 2022/0285355 A1    Sep. 8, 2022

Related U.S. Application Data

(63) Continuation of application No. 17/086,628, filed on Nov. 2, 2020, now Pat. No. 11,355,496.

(60) Provisional application No. 63/038,154, filed on Jun. 12, 2020, provisional application No. 62/968,396, filed on Jan. 31, 2020.

(51) Int. Cl.
*H10B 12/00* (2023.01)

(52) U.S. Cl.
CPC ........... *H10B 12/30* (2023.02); *H10B 12/488* (2023.02)

(58) Field of Classification Search
CPC .... H10B 12/02; H10B 12/03; H10B 12/0335; H10B 12/036; H10B 12/05; H10B 12/056; H10B 12/30; H10B 12/33; H10B 12/36; H10B 12/488; H10D 1/68; H10D 30/6728;
(Continued)

(56) References Cited

U.S. PATENT DOCUMENTS

| 10,872,894 B2 | 12/2020 | Juengling |
| 2012/0147649 A1 | 6/2012 | Samachisa et al. |

(Continued)

FOREIGN PATENT DOCUMENTS

| KR | 20190123163 A | 10/2019 |
| WO | 2016069487 A1 | 5/2016 |

OTHER PUBLICATIONS

Notice of Allowance dated Jan. 27, 2022 for U.S. Appl. No. 17/086,628.

*Primary Examiner* — Britt D Hanley
*Assistant Examiner* — Kevin Quinto
(74) *Attorney, Agent, or Firm* — Eschweiler & Potashnik, LLC

(57) ABSTRACT

A semiconductor device comprises a semiconductor substrate, and a pair of metal gates extends upwards from the semiconductor substrate. First and second channel regions are disposed between inner sidewalls of the pair of metal gates. First and second drain regions are disposed between the inner sidewalls of the pair of metal gates and are disposed directly over the first and second channel regions, respectively. First and second source regions are disposed between the inner sidewalls of the pair of metal gates directly below the first and second channel regions, respectively. A capacitor dielectric structure is disposed below the first and second source regions. A bottom capacitor electrode is disposed below the capacitor dielectric. The capacitor dielectric structure separates the first and second drain regions from the bottom capacitor electrode.

20 Claims, 12 Drawing Sheets

(58) Field of Classification Search
CPC ... H10D 30/6755; H10D 86/423; H10D 86/60
See application file for complete search history.

(56) References Cited

U.S. PATENT DOCUMENTS

| | | |
|---|---|---|
| 2017/0025431 A1 | 1/2017 | Kanakamedala et al. |
| 2019/0067298 A1* | 2/2019 | Karda ............... H10D 84/813 |
| 2019/0237467 A1 | 8/2019 | Kim et al. |

* cited by examiner

HIGH-DENSITY 3D-DRAM CELL WITH SCALED CAPACITORS

REFERENCE TO RELATED APPLICATIONS

This Application is a Continuation of U.S. application Ser. No. 17/086,628, filed on Nov. 2, 2020, which claims the benefit of U.S. Provisional Application No. 62/968,396, filed on Jan. 31, 2020 & U.S. Provisional Application No. 63/038, 154, filed on Jun. 12, 2020. The contents of the above-referenced Patent Applications are hereby incorporated by reference in their entirety.

BACKGROUND

Dynamic random access memory (DRAM) is one type of semiconductor memory. In essence, a DRAM device typically includes an array of DRAM cells where each DRAM cell stores a bit of data. To store its bit, each DRAM cell includes a capacitor and an access transistor. The capacitor has one of its electrodes coupled to a fixed voltage (e.g., ground) while the other electrode is coupled to the access transistor of that DRAM cell. The access transistor can be selectively enabled so different amounts of charge, which correspond to different data states, respectively, can be placed on the capacitor during write operations. For example, placing a large amount of charge on the capacitor corresponds to a logical "1", while placing a small amount of charge on the capacitor (or removing charge from the capacitor) may correspond to a logical "0". Because charge may tend to "leak" from the capacitors of the DRAM over time, the DRAM cells need to be regularly "refreshed" by re-writing charge levels to the capacitors over time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
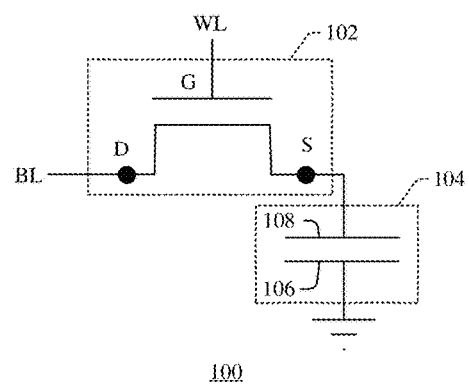
FIG. 1 depicts a schematic representation of some embodiments of a DRAM cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90degrees or at other orientations) and the spatially relative descriptors used herein may likewise be interpreted accordingly.

FIG. 1 illustrates an example schematic of a dynamic random access memory (DRAM) cell 100. The DRAM cell 100 includes an access transistor 102 and a capacitor 104. The capacitor 104 has one of its electrodes 106 coupled to a fixed voltage (e.g., ground) while the other electrode 108 is coupled to the access transistor 102. A gate (G) of the access transistor 102 is coupled to a wordline (WL), which can be selectively enabled to selectively couple a bitline (BL) to the capacitor 104. During write operations, different amounts of charge, which correspond to different data states, respectively, can be placed on the capacitor 104 through the BL and access transistor 102. Further, during read operations, the amount of charge present on the capacitor 104 at a given time can be read by asserting the wordline WL and monitoring the current or voltage on the BL, thereby allowing the data state stored in the DRAM cell to be read.

For example, in some embodiments a large amount of charge can be written to the capacitor 104 to represent a logical "1" state; or a small amount of charge can be written to the capacitor 104 (and/or charge can be stripped off the capacitor 104) to represent a logical "0" state, though the amount of charge and the logical states can be flipped in other embodiments. Because charge may tend to "leak" from the capacitor 104 over time, and this leakage potentially degrades the data state stored in the DRAM cell, DRAM devices need to be regularly "refreshed" by re-writing intended charge levels to their capacitors over time.

One advantage of DRAM compared to many other types of memory is that DRAM cells may be smaller in terms of area, which allows a large number of DRAM cells to be put on a memory chip, thereby enabling dense memory densities. A conventional DRAM cell can be formed by etching a trench into a semiconductor substrate, lining the trench with a dielectric, and forming a conductive electrode over the dielectric to form a trench capacitor. Generally, DRAMs with deeper trenches tend to have larger capacitances, such that more charge can be stored in each capacitor, which is beneficial as it allows for longer times between refresh operations. However, deeper trenches also take more time to manufacture and may tend to get slightly wider compared to shallower trenches, which means that the footprint of the deeper trenches may also tend to be somewhat larger for a given technology node.

Further, scalability of conventional DRAM cells is limited by leakage current. For example, because the charge level stored in a DRAM capacitor corresponds to a data state stored in the DRAM cell, higher leakage from the DRAM capacitor causes the stored charge (and hence the data state) to degrade more quickly. Further, current leakage through the access transistor of the DRAM cell can also lead to less charge than desired being written to the DRAM capacitor. In some cases, this leaked charge can affect neighboring DRAM capacitors in a DRAM array, possibly corrupting data states stored in those DRAM capacitors. Whatever the case, leakage can cause performance concerns and/or data retention concerns, and is less than ideal.

In this disclosure, various three-dimensional DRAM cells are provided. Each DRAM cell includes an access transistor and a DRAM capacitor that are disposed over a semiconductor substrate. The access transistor includes a channel region that is vertically spaced between a source region and a drain region. The channel region for at least some of the DRAM cells is made of a low-leakage material, and allows for multi-level integration schemes to achieve dense DRAM storage. In some embodiments, the channel region includes an oxide semiconductor, such as Indium Gallium Zinc Oxide (IGZO), Indium Zinc Oxide (IZO), etc., which can exhibit extremely low-leakage currents ($I_{ON}/I_{OFF} > 10^{13}$). Thus, the disclosed three-dimensional DRAM cells offer a good balance of high data retention due to the low-leakage material, and also offer dense data storage because of the small footprint offered by the multi-level integration of the DRAM cells. It will be appreciated that although embodiments herein are described with respect to access transistors in the form of metal-oxide-semiconductor field effect transistors (MOSFETs), other types of transistors such as a bipolar junction transistors (BJTs), junction FETs, and/or finFETs, among others, are also contemplated as falling within the scope of the present disclose in place of the illustrated/described access transistors.

Figures 2A, 2B:
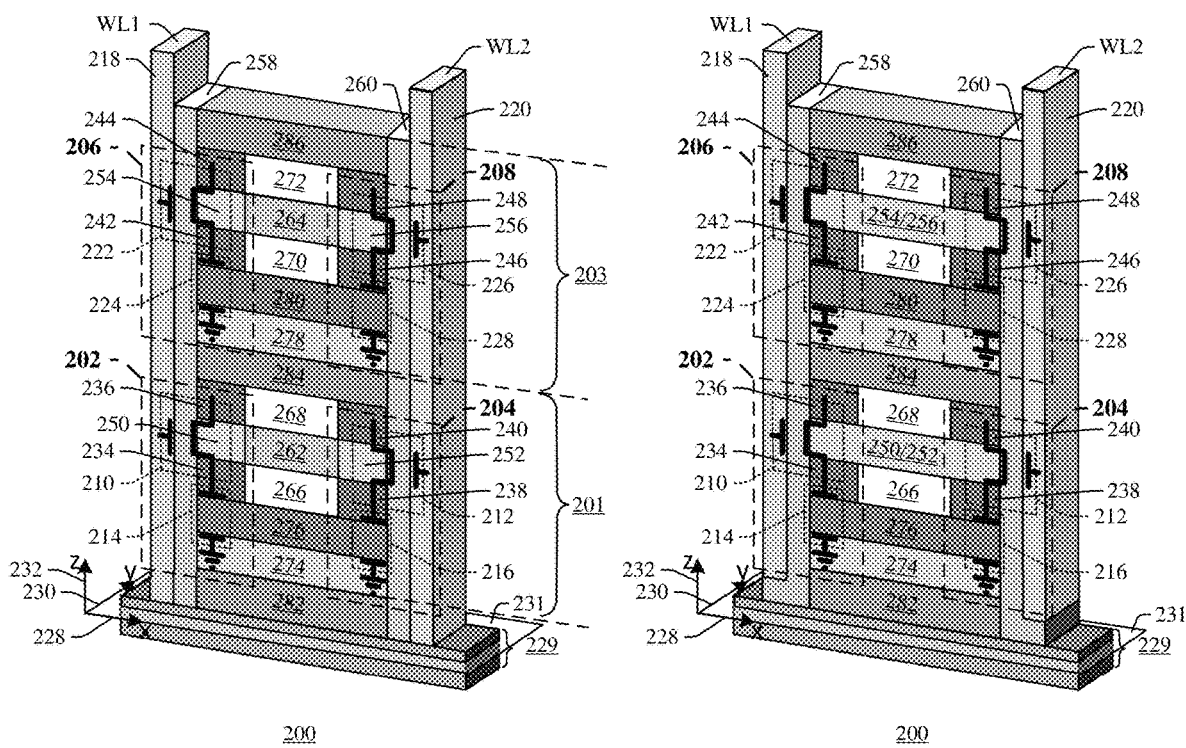
FIGS. 2A-2D depict perspective views of some embodiments of a portion of a DRAM memory device that includes four DRAM cells.

Referring now to FIG. 2A, one can see a portion of a memory device 200 in accordance with some embodiments of the present disclosure. The illustrated portion of the memory device 200 includes multiple memory stacks (e.g., first memory stack 201 and second memory stack 203) which are stacked over one another and arranged so as to include four DRAM cells (e.g., first DRAM cell 202, second DRAM cell 204, third DRAM cell 206, and fourth DRAM cell 208). Each DRAM cell generally has the same schematic as illustrated in FIG. 1. It will be appreciated that additional memory stacks can be "stacked" over the illustrated first memory stack 201 and second memory stack 203 to provide any number of DRAM cells stacked over one another.

In particular, FIG. 2's memory device 200 includes a first DRAM cell 202 and a second DRAM cell 204 that are spaced laterally apart from one another. The first DRAM cell 202 and second DRAM cell 204 have first and second access transistors (210, 212, respectively), and first and second data storage capacitors (214, 216, respectively). A first gate electrode of the first access transistor 210 is coupled to a first wordline (WL1) 218 and a second gate electrode of the second access transistor 212 is coupled to a second wordline (WL2) 220. The memory device also includes a third DRAM cell 206 stacked over the first DRAM cell 202, and a fourth DRAM cell 208 stacked over the second DRAM cell 204. The third DRAM cell 206 and fourth DRAM cell 208 have third and fourth access transistors (222, 226, respectively), and third and fourth data storage capacitors (224, 228, respectively). A third gate electrode of the third access transistor 222 is coupled to the first wordline (WL1) 218. A fourth gate electrode of the fourth access transistor 226 is coupled to the second wordline (WL2) 220.

As shown, these components of the memory device 200 are disposed on a semiconductor substrate 229 that extends generally along a plane 231. The semiconductor substrate 302 can manifest as a monocrystalline silicon substrate, a semiconductor on insulator (SOI) substrate, or another substrate; and can include multiple substrates and/or interconnect structures stacked over one another. The plane 231 is defined along a first direction 228 (e.g., x-direction) and a second direction 230 (e.g., y-direction), wherein the first direction 228 is perpendicular to the second direction 230.

The first wordline 218 and second wordline 220 extend upward from the plane of the semiconductor substrate in a third direction 232 (e.g., z-direction). The third direction 232 is perpendicular to the first direction 228 and the second direction 230. In some embodiments, the first wordline 218 and second wordline 220 comprise copper (Cu), and/or tungsten (W), among others. In some embodiments, the first wordline 218 and second wordline 220 each have a thickness as measured perpendicularly in the first direction 228 (e.g., in the x-direction) between their respective inner and outer sidewalls ranging between 10 nm and 30 nm.

The access transistor for each of the DRAM cells includes a pair of source/drain regions and a channel region that vertically separates the pair of source/drain regions for a given DRAM cell. First and second gate dielectric layers 258, 260 are disposed on inner sidewalls of the first and second wordlines 218, 220, respectively, to separate the first and second wordlines from the source/drain regions and the channel regions.

Thus, the first DRAM cell 202 includes a first source region 234 and a first drain region 236; the second DRAM cell 204 includes a second source region 238 and a second drain region 240; the third DRAM cell 206 includes a third source region 242 and a third drain region 244; and the fourth DRAM cell 208 includes a fourth source region 246 and a fourth drain region 248. It will be appreciated that the naming convention of "source" and "drain" as used herein is somewhat arbitrary, and these terms can be interchanged in other embodiments and/or can be alternatively referred to as source/drain regions. In some embodiments, the source/drain regions comprise tungsten (W), copper (Cu), Titanium nitride (TiN), tantalum nitride (TaN), doped semiconductor material (e.g., p-doped or n-doped silicon), and/or other CMOS contact metals. In some embodiments, the source/drain regions can each have a thickness measured in the third direction 232 (e.g., in the z-direction) ranging between 10 nm and 30 nm.

The first DRAM cell 202 also includes a first channel region 250; the second DRAM cell 204 includes a second channel region 252; the third DRAM cell 206 includes a third channel region 254; and the fourth DRAM cell 208 includes a fourth channel region 256. The first and second channel regions 250, 252 are disposed at a first height over an upper surface of the semiconductor substrate 229 as measured in the third direction 232, while the third and fourth channel regions 254, 256 are disposed at a second height over the upper surface of the semiconductor substrate 229 as measured in the third direction. The second height is greater than the first height. Further, in some embodiments, the first, second, third, and fourth channel regions 250, 252, 254, 256 comprise an oxide semiconductor material such as indium gallium zinc oxide (IGZO), indium zinc oxide (IZO), indium tin oxide (ITO), or another oxide semiconductor material. In some embodiments, the channel regions can each have a thickness measured in the third direction 232 (e.g., in the z-direction) ranging between 5 nm and 30 nm.

In some embodiments, the first and second gate dielectric layers 258, 260 extend continuously and with a substantially constant thickness from the upper surface of the substrate 229 to at least a height corresponding to an uppermost DRAM cell between the first and second wordlines. In some embodiments, the first and second gate dielectric layers 258, 260 comprise aluminum oxide (Al2O3), Hafnium oxide (HfO2), tantalum oxide (Ta2O5), Zirconium oxide (ZrO2), Titanium oxide (TiO2), strontium titanium oxide (SrTiO3), or another high-k dielectric material, among others. In some embodiments, the first and second gate dielectric layer 258, 260 are formed by atomic layer deposition, and can each have a thickness measured in the first direction 228 (e.g., x-direction) ranging between 1 nm and 3 nm.

In some embodiments, dielectric regions laterally separate the channel regions from one another. Thus, in FIG. 2A, a first oxide region 262 is disposed at the first height over the semiconductor substrate 229 and is arranged midway between the inner sidewalls of the first and second wordlines 218, 220 and separates the first and second channel regions 250, 252 from one another. A second oxide region 264 is disposed at the second height over the semiconductor substrate 229 and is substantially aligned with the first oxide region 262 and separates the third and fourth channel regions 254, 256 from one another. In some embodiments, the dielectric regions can comprise silicon dioxide (SiO2) and can have a thickness measured in the third direction 232 (e.g., z-direction) ranging between 5 nm and 30 nm.

In some embodiments, sacrificial regions are disposed above and below the oxide regions and aligned there over and laterally separate the source/drain regions from one another. For example, a first sacrificial region 266 laterally separates the first and second source regions 234, 238 from one another. A second sacrificial region 268 laterally separates the first and second drain regions 236, 240 from one another. A third sacrificial region 270 laterally separates the third and fourth source regions 242, 246 from one another. A fourth sacrificial region 272 laterally separates the third and fourth drain regions 244, 248 from one another. In some embodiments, the sacrificial regions 266, 268, 270, 272 are a dielectric material and have a high selectivity for etching relative to the first and second oxide regions 262, 264 and comprise silicon nitride (Si3N4), silicon oxynitride (SiOxNy), or another nitride, for example. The sacrificial regions can each have a thickness measured in the third direction 232 (e.g., in the z-direction) ranging between 10 nm and 30 nm.

With regards to the data storage capacitors in each DRAM cell (e.g., data storage capacitors 214, 216, 224, 228), each capacitor includes an upper capacitor electrode corresponding to the drain of the access transistor of the DRAM cell and a lower capacitor electrode that is vertically spaced apart from the upper capacitor electrode by a capacitor dielectric structure. Thus, in FIG. 2A, the first data storage capacitor 214 has a first upper electrode corresponding to first source 234 and a first lower electrode corresponding to first conductive region 274, wherein a first capacitor dielectric 276 separates the first upper electrode from the first conductive region 274. The second data storage capacitor 216 has a second upper electrode corresponding to second source 238 and a second lower electrode corresponding to the first conductive region 274, wherein the first capacitor dielectric 276 separates the second upper electrode from the first conductive region 274. The first conductive region 274 is coupled to a DC voltage, such as ground or VSS. Further, the third data storage capacitor 224 has a third upper electrode corresponding to third source 242 and a third lower electrode corresponding to second conductive region 278, wherein a second capacitor dielectric 280 separates the third upper electrode from the second conductive region 278. The fourth data storage capacitor 228 has a fourth upper electrode corresponding to fourth source 246 and a fourth lower electrode corresponding to the second conductive region 278, wherein the second capacitor dielectric 280 separates the fourth upper electrode from the second conductive region 278. The second conductive region 278 is coupled to a DC voltage, such as ground or VSS. In some embodiments, the first conductive region 274 and second conductive region 278 can have a thickness of 10 nm to 30 nm and can comprise copper, tungsten, among others.

In some embodiments, the first and second capacitor dielectrics 276, 280 comprise aluminum oxide (Al2O3), Hafnium oxide (HfO2), tantalum oxide (Ta2O5), Zirconium oxide (ZrO2), Titanium oxide (TiO2), strontium titanium oxide (SrTiO3), or another high-k dielectric material, among others. The first and second capacitor dielectrics 276, 280 can each have a thickness measured in the third direction 232 (e.g., z-direction) ranging between 1 nm and 5 nm.

Dielectric isolation regions 282, 284, 286 extend in parallel with one another, and perpendicular to the first wordline and the second wordline, to separate the DRAM cells from one another. In some embodiments, the dielectric isolation regions 282, 284, 286 comprise aluminum oxide (Al2O3), Hafnium oxide (HfO2), tantalum oxide (Ta2O5), Zirconium oxide (ZrO2), Titanium oxide (TiO2), strontium titanium oxide (SrTiO3), or another high-k dielectric material, among others. The dielectric isolation regions 282, 284, 286 can each have a thickness ranging between 5 nm and 30 nm.

FIG. 2B show another embodiment of a portion of a DRAM device 200 in accordance with some embodiments. Compared to FIG. 2A, the DRAM device 200 of FIG. 2B has channel regions 250/252 and 254/256 that extend continuously and entirely between inner sidewalls of the gate dielectric 258, 260. The embodiment of FIG. 2A may offer some advantages with better isolation between adjacent channel regions, due to the presence of oxides 262 and 264 offering better isolation, however, the embodiment of FIG. 2B may provide more efficient (e.g., less complexity and/or expense) than the embodiment of FIG. 2A, due to the presence of the continuous channel regions 250/252 and 254/256 in FIG. 2B. The channel regions 250/252 and 254/256 in FIG. 2B can comprise oxide semiconductor material such as indium gallium zinc oxide (IGZO), indium zinc oxide (IZO), indium tin oxide (ITO), or another oxide semiconductor material. Further, the gate dielectrics 258, 260 in FIG. 2B extend under bottom surfaces of the first and second wordlines 218, 220, which may also make manufacturing more efficient in some regards, and may provide better isolation and/or lower contamination in some embodiments.

Figure 2C:
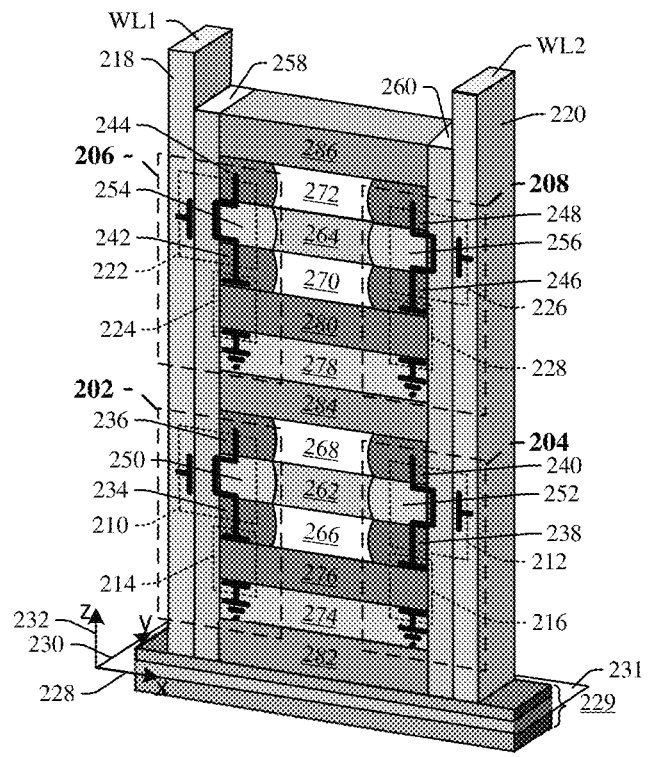
Figure 2D:
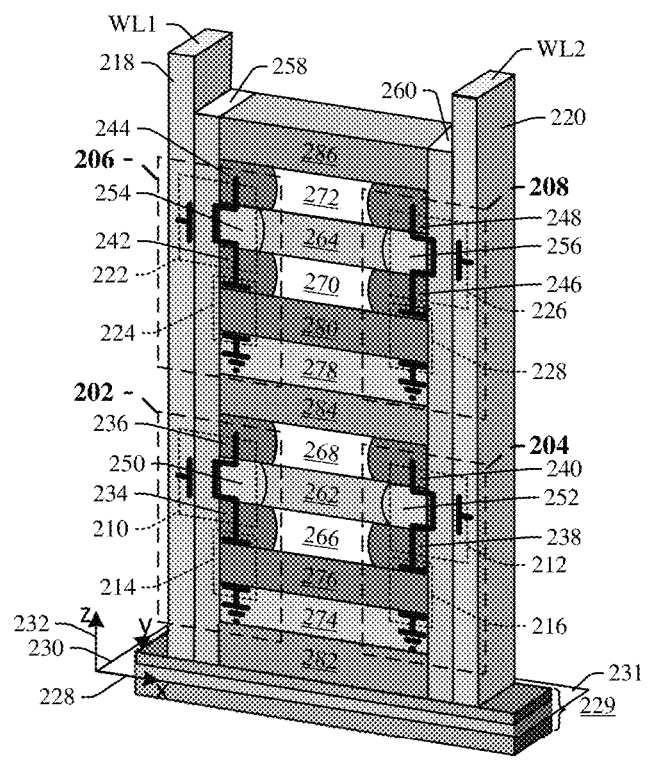

As shown in FIG. 2C, in some embodiments the source regions, drain regions, and/or channel regions may have rounded inner edges, which can for example arise from a lateral etch used to form these respective regions. In the embodiment of FIG. 2C, the rounded inner edges of the source regions, drain regions, and/or channel regions are substantially aligned with one another. As shown in FIG. 2D, in some embodiments the source regions and drain regions may have rounded inner edges that are substantially aligned, while the channel regions have be deeper or shallower than the source regions and drain regions, thereby providing an offset. This case in FIG. 2D may arise for example, when separate etches are used to form the source/drain regions and channel regions, leading to the different depths of the regions.

Figure 3A:
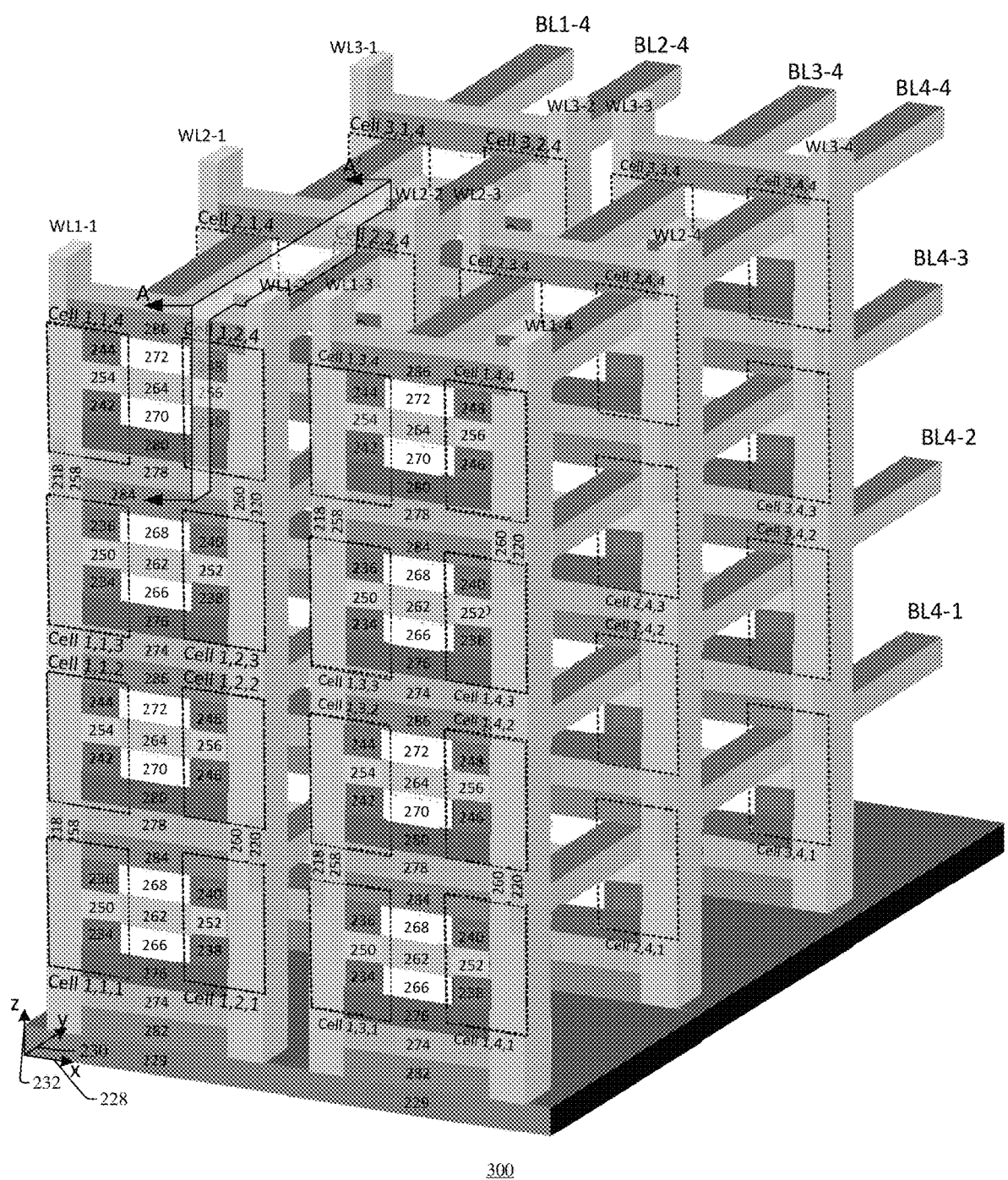
FIG. 3A depicts a perspective view of some embodiments of a portion of a DRAM device that includes 48 DRAM cells.
Figure 3B:
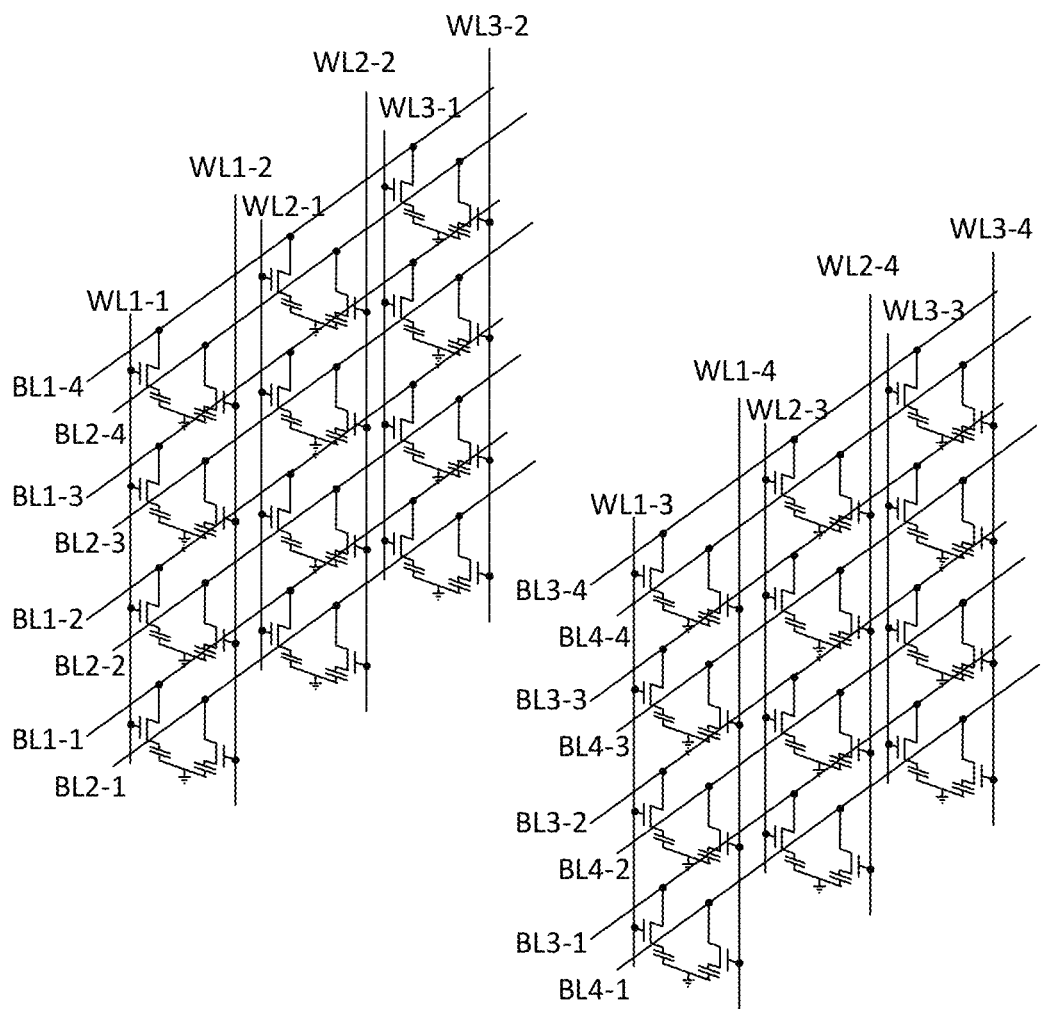
FIG. 3B depicts a schematic view of a portion of a DRAM device that includes 48 DRAM cells consistent with some embodiments of FIG. 3A.

FIG. 3A depicts a larger portion of a DRAM device 300 as a three-dimensional perspective view, while FIG. 3B shows a corresponding schematic representation of the DRAM device. The DRAM device 300 of FIGS. 3A-3B may comprise some aspects the memory device 200 in FIGS. 2A-2B (and vice versa); and thus, the features and/or reference numerals explained above with regards to FIG. 2A-2B are also applicable to the device 300 in FIGS. 3A-3B.

Generally, whereas FIG. 2A and FIG. 2B each depicted a "stack" of four DRAM cells arranged such that two lower DRAM cells (e.g., 202, 204) are spaced between two neighboring wordlines (e.g., 218, 220) and two upper DRAM cells (e.g., 206, 208) are arranged over the two lower DRAM cells (e.g., 202, 204, respectively); FIG. 3A and FIG. 3B each depict six "double stacks" that each include eight DRAM cells arranged similar to as in FIG. 2A and/or FIG. 2B. Thus, whereas a "stack" in FIG. 2A and FIG. 2B included four DRAM cells (e.g., 2 cells side-by side and stacked two high) arranged between two neighboring wordlines, the "double stacks" in FIGS. 3A and FIG. 3B each include eight DRAM cells (e.g., 2 cells side-by side and stacked four high) between two neighboring wordlines. Conductive bitlines (BL) extend continuously in the second direction (e.g., y-direction) to couple drain regions of neighboring DRAM cells to one another. Thus, in FIGS. 3A-3B a first double "stack" of four DRAM cells is arranged between wordlines WL1-1 and WL1-2, a second "stack" of four DRAM cells is arranged between wordlines WL1-3 and WL1-4, a third "stack" of four DRAM cells is arranged between wordlines WL2-1 and WL2-2, a fourth "stack" of four DRAM cells is arranged between wordlines WL2-3 and WL2-4, a fifth "stack" of four DRAM cells is arranged between wordlines WL3-1 and WL3-2, and a sixth "stack" of four DRAM cells is arranged between wordlines WL4-3 and WL4-4. In general, in the depicted architecture the number of DRAM cells could be "stacked" higher than illustrated to increase memory density on chip. For clarity and consistency, the labeling and naming conventions of FIG. 2A-2B have been re-applied to FIGS. 3A-3B and FIG. 4A-4B where applicable, though it will be appreciated that the terms "first", "second", "third", and the like are merely generic identifiers and can be interchanged/transposed between various embodiments, and thus these terms do no imply particular structural relationships in and of themselves. For example, although the figures of this disclosure may be described as having a third element over a first element (and/or a second element to the right of a first element), in other embodiments a first element could be over a third element (and/or a second element could be to the left of a first element), and so on.

FIGS. 4A-4D show various embodiments along plane A-A' as illustrated in FIG. 3A. In each of FIG. 4A-4D, one can see that a bitline 249 extends continuously between fourth (left) drain region 248-1 and fourth (right) drain region 248-2. In some embodiments, the bitline 249 and drain regions 248-1, 248-2 are a single body of material that extends continuously between source/drain regions that are coupled together, and thus, the bitline 249 and drain regions 248-1, 248-2 can comprise tungsten (W), copper (Cu), Titanium nitride (TiN), tantalum nitride (TaN), doped semiconductor material (e.g., p-doped or n-doped silicon), and/or other CMOS contact metals.

Figure 4A:
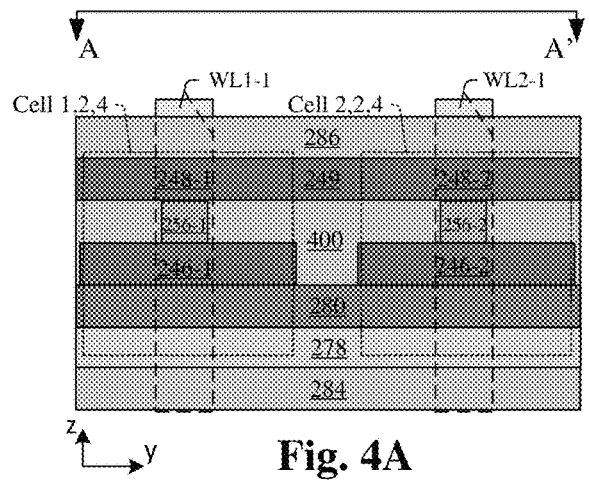
FIGS. 4A-4D show a series of cross-sectional views along cut-away plane A-A' consistent with various embodiments of FIG. 3A.
Figure 4B:
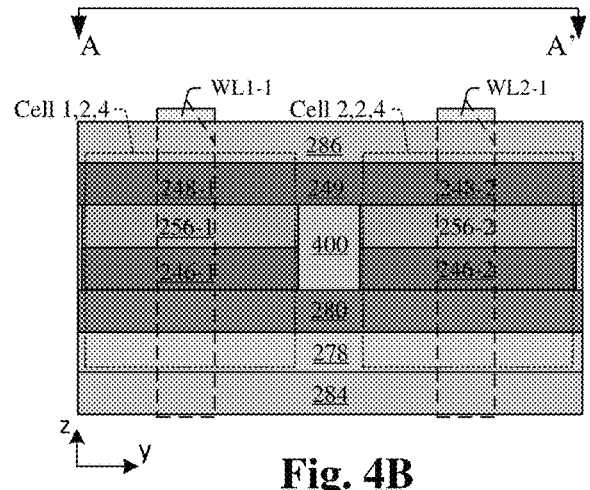
Figure 4C:
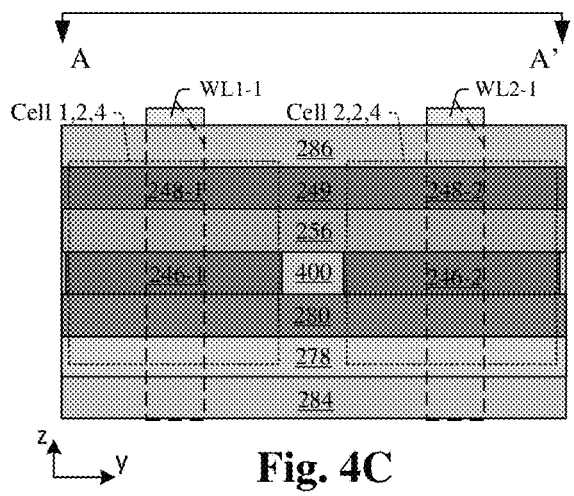
Figure 4D:
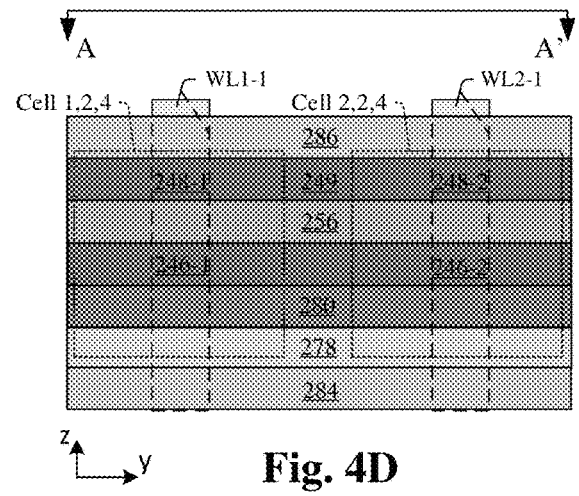

In FIG. 4A-4B, the fourth channel region (left) 256-1 and fourth channel region (right) 256-2 are spaced apart from one another by a low-k dielectric 400, which also separates the fourth source region (left) 246-1 and fourth source region (right) 246-2 from one another. In FIG. 4A, the fourth channel region (left) 256-1 and fourth channel region (right) 256-2 are narrower than the fourth source region (left) 246-1 and fourth source region (right) 246-2, respectively, which may arise from the manufacturing process when different etches are used to form the channel regions and drains. The embodiment of FIG. 4A may offer improved isolation between the fourth channel region (left) 256-1 and the fourth channel region (right) 256-2 because of the thicker low-k dielectric 400 there between. In contrast, in FIG. 4B, the fourth channel region (left) 256-1 and fourth channel region (right) 256-2 have widths that are equal to the fourth source region (left) 246-1 and fourth source region (right) 246-2, respectively, which may offer potentially lower isolation than the embodiment of FIG. 4A but which may be manufactured more reliably/consistently. Further still, in FIG. 4C, the fourth channel region 256 is a continuous body of material between the fourth source region (left) 246-1 and fourth source region (right) 246-2, which provides less isolation but also provides further ease of manufacturing. Finally, FIG. 4D provides another embodiment where the source region 246 is also a continuous body which provides still further ease of manufacturing, but which may provide less reliable data retention than the embodiments of FIGS. 4A-4C.

Turning now to FIGS. 5-17, one can see a series of cross-sectional views that illustrate a method of manufacturing a DRAM device.

Figure 5:
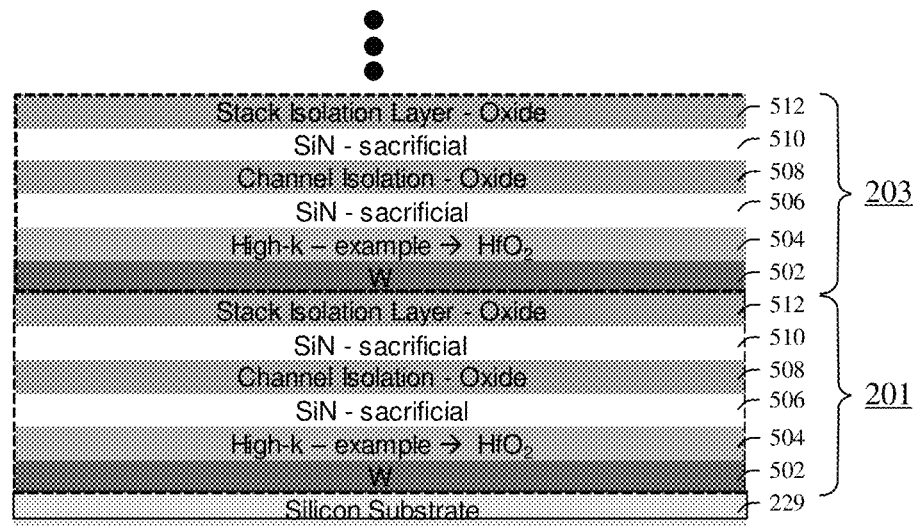
FIGS. 5-16 depict a series of cross-sectional views that collectively depict a manufacturing flow for making a DRAM device.

In FIG. 5, a number of layers are deposited over a semiconductor substrate 229. The layers may include multiple memory stacks (e.g., first memory stack 201, second memory stack 203) stacked over one another, wherein each memory stack includes a conductive region 502, a capacitor dielectric layer 504 over the conductive region, a lower sacrificial layer 506 over the capacitor dielectric layer, a channel isolation layer 508 over the lower sacrificial layer 506, an upper sacrificial layer 510 over the channel isolation layer 264, and an upper isolation layer 512 over the upper sacrificial layer 510. In some embodiments, the bottom-most memory stack (e.g., 201) is optionally separated from the semiconductor substrate 229 by a dielectric isolation region (see FIG. 2, 282), which may be a standalone layer or may be included in a back-end-of-line (BEOL) interconnect structure that includes multiple dielectric layers and horizontal wiring layers and vertical vias that are coupled to semiconductor devices (e.g., transistors) in the semiconductor substrate 229.

Figure 6:
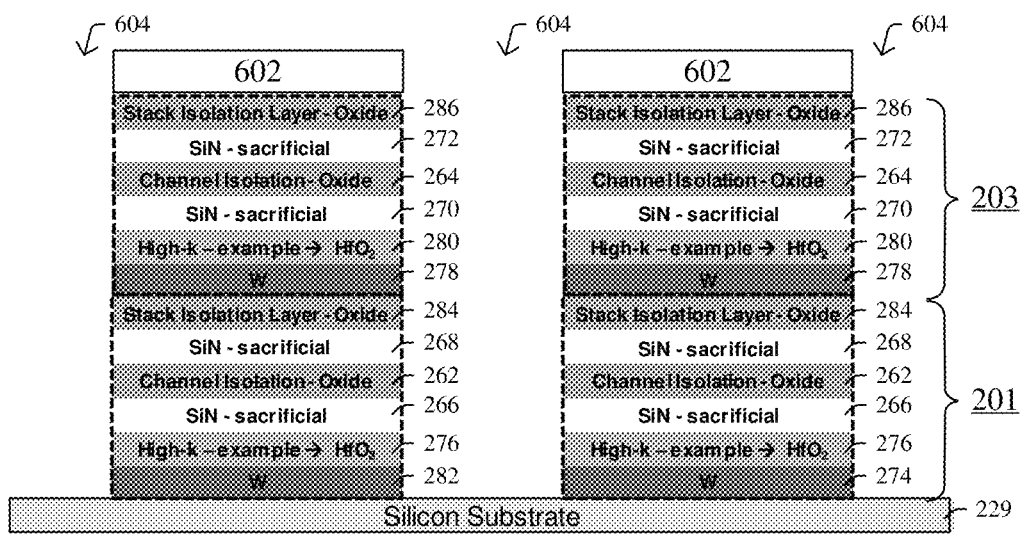

In FIG. 6, a first mask 602, such as a photomask is patterned over the uppermost memory stack (e.g., 203), and a wet or dry etch is carried out with the first mask 602 in place. The wet etch or dry etch can proceed down to the substrate 229. Thus, in FIG. 6, two columns of patterned memory stack structures are formed and are separated from one another by a trench 604, though it will be appreciated that in general any number of memory stack structures can be formed. Each patterned memory stack structure can include a first lower conductive region 274, a first capacitor dielectric 276, a first lower sacrificial region 266, a first oxide region 262, a first upper sacrificial region 268, and a first dielectric isolation region 284; and a second lower conductive region 278, a second capacitor dielectric 280, a second lower sacrificial region 270, a second oxide region 264, a second upper sacrificial region 272, and a second dielectric isolation region 286.

Figure 7:
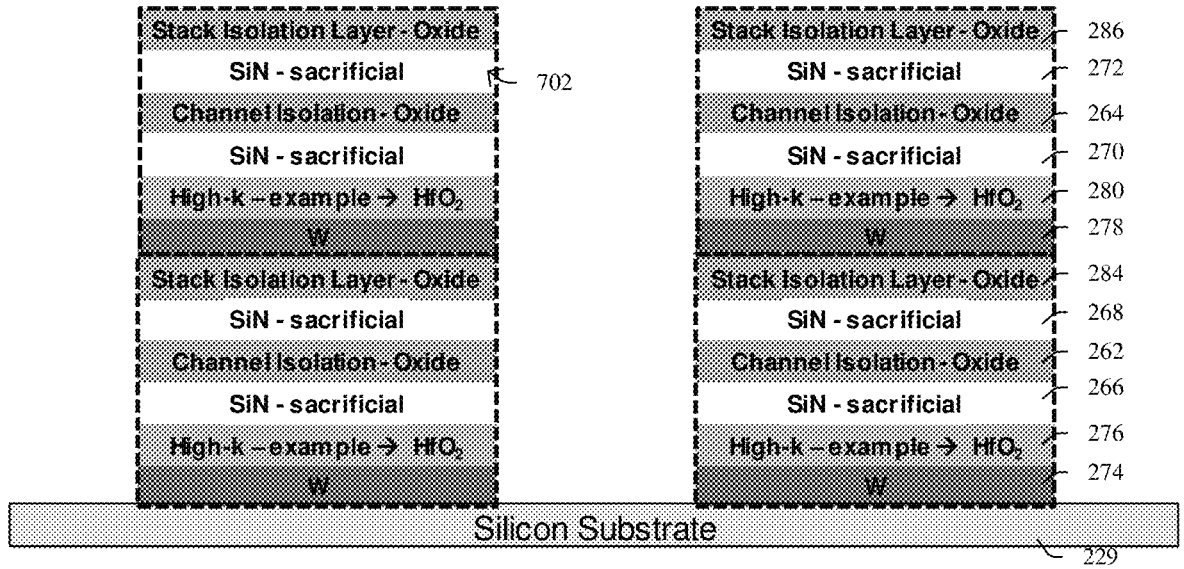

In FIG. 7, with the first mask 602 still in place, a lateral etch, such as a wet etch for example, is carried out to remove outermost portions of the sacrificial regions in each memory stack structure, and forming first recesses 702. In some embodiments, the lateral etch can comprise phosphoric acid (e.g., H3PO4) chemistry. Thus, the lateral etch can be selective to remove the outermost portions of the sacrificial regions while leaving the isolation layers and other layers of the stack substantially in place.

Figure 8:
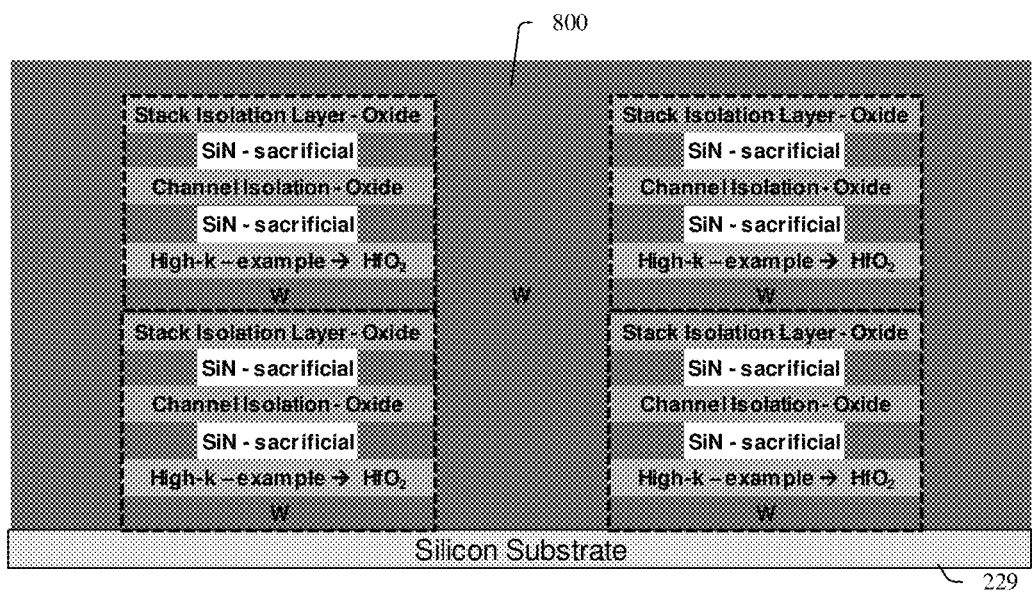

In FIG. 8, a conductive material 800 is deposited to fill in the trenches between the patterned columns of memory stack structures and to fill in the first recesses. In some embodiments, the conductive material 800 is formed by a physical deposition process, such as sputtering, electroplating, atomic layer deposition, or physical vapor deposition. In some embodiments, the conductive material 800 is a metal, and can comprise tungsten because of tungsten's good fill properties and affinity for filling small gaps without forming voids.

Figure 9:
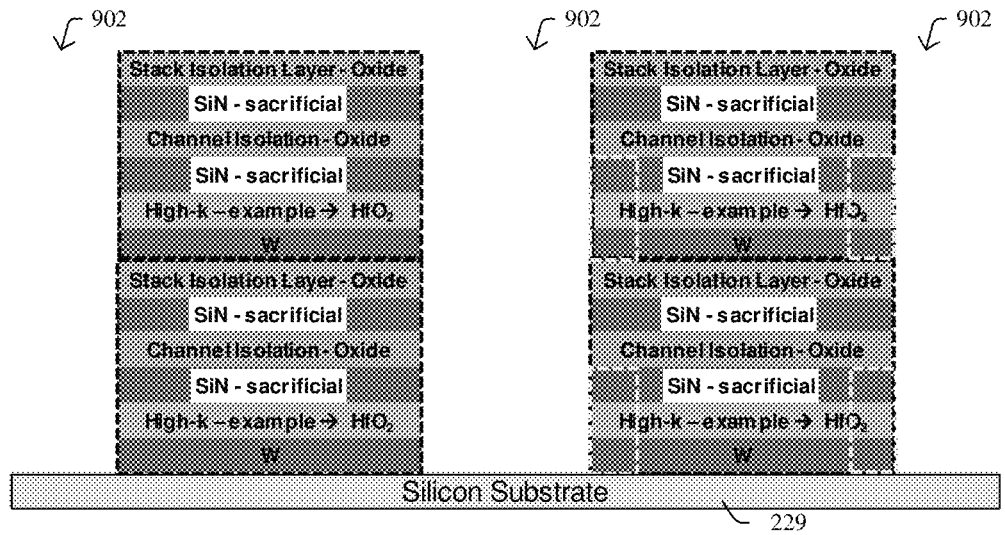

In FIG. 9, a chemical mechanical planarization (CMP) operation is carried out on the upper surface of the structure to remove upper most portions of the conductive material 800 over the uppermost isolation structures. Then, after the CMP operation is carried out, an etch is carried out to remove the conductive material 800 from between the columns of memory stack structures, thereby re-opening trenches 902. For example, in some embodiments, a second mask is patterned over the memory stack structures, and the etch can be carried out with the second mask in place to facilitate the removal of the conductive material 800.

Figure 10:
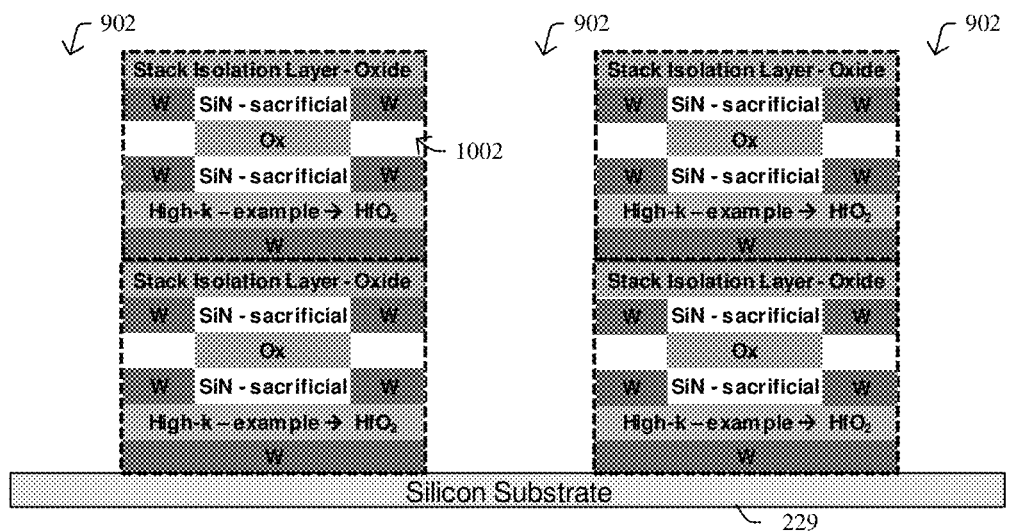

In FIG. 10, a second lateral etch is carried out to remove an outermost portion of the channel isolation layers, thereby forming second recesses 1002 in outer edges of the memory stack columns between the lower conductive regions and upper conductive regions of each memory stack. In some embodiments, this etch is a wet etch or a dry etch and comprises fluorine.

Figure 11:
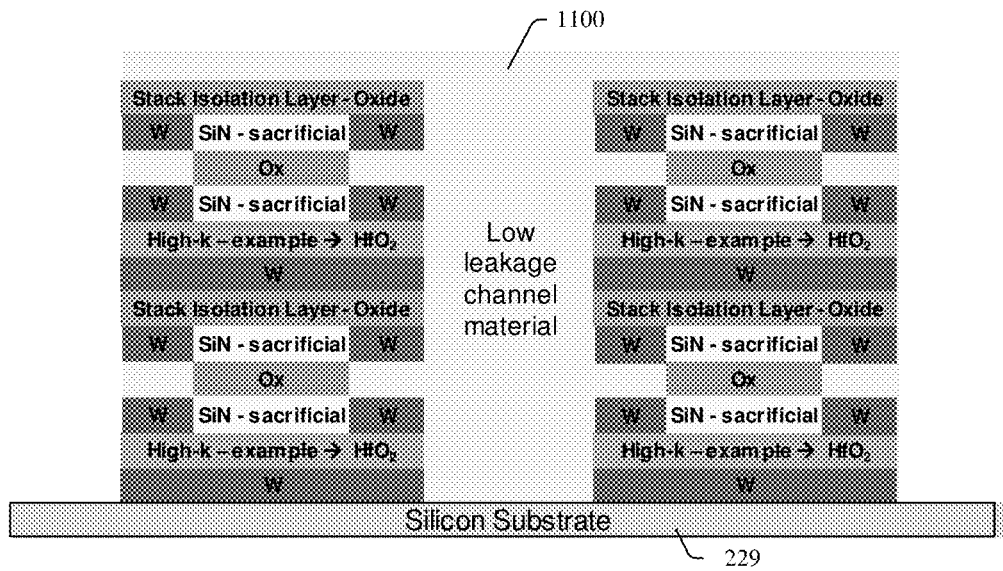

In FIG. 11, low-leakage channel material 1100 is deposited to fill the second recesses formed in FIG. 10, and to fill the trenches between neighboring columns of memory stacks. The low-leakage channel material 1100 can comprise an oxide semiconductor material, and can be formed by physical vapor deposition (e.g., sputtering, ALD, electroplating), chemical vapor deposition, or atomic layer deposition. In some embodiments, the low-leakage channel material 1100 comprises indium gallium zinc oxide (IGZO), indium zinc oxide (IZO), indium tin oxide (ITO), or another oxide semiconductor material. In some embodiments, the channel regions can each have a thickness ranging between 5 nm and 30 nm.

Figure 12:
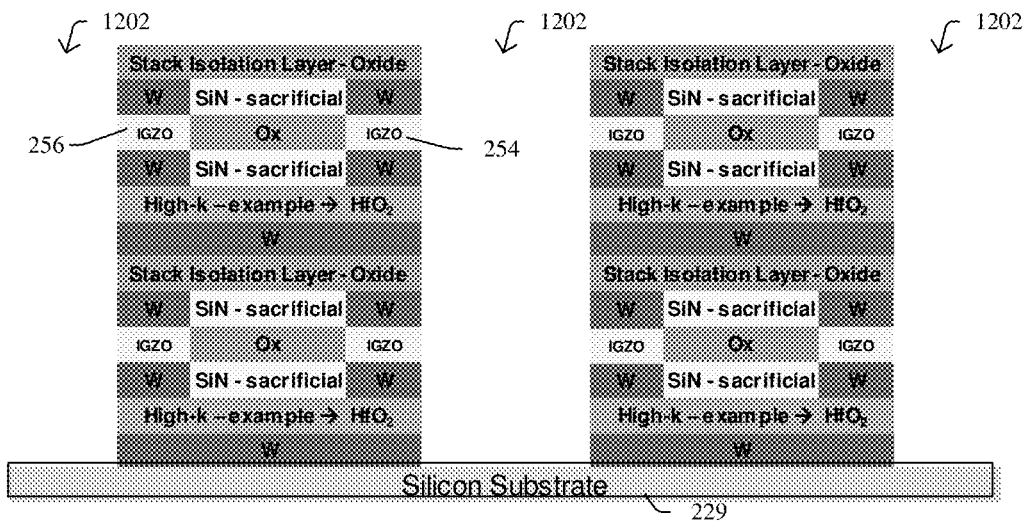

In FIG. 12, an etch is performed to remove portions of the low-leakage channel region 1100 to re-open the trenches 1202 between neighboring columns of memory stacks. In some embodiments, this etch includes a CMP operation to remove upper most portions of the low-leakage channel material over the memory stacks. Then, after the CMP a third photomask can be formed and a wet or dry etch is carried out with the third photomask in place to remove the portion of the low-leakage channel material to re-open the trenches 1202 between the neighboring columns of memory stacks down to a bottom conductive layer and/or to the semiconductor substrate.

Figure 13:
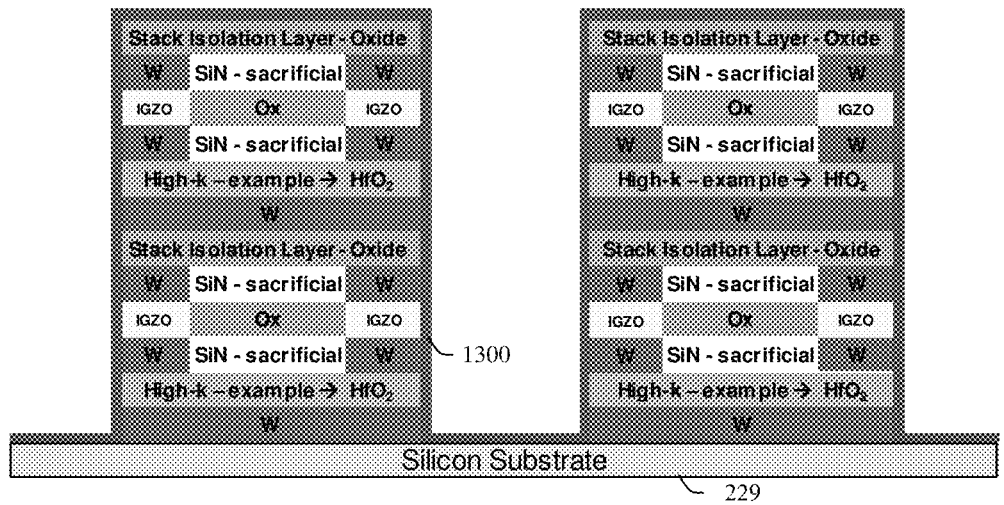

In FIG. 13, a high-k gate dielectric 1300 is formed over an upper surface of the memory stack regions, along sidewalls of the memory stack regions, and over an exposed upper surface of the semiconductor substrate between the memory stack regions. The high-k gate dielectric 1300 can thus be a conformal layer comprising aluminum oxide (Al2O3), Hafnium oxide (HfO2), tantalum oxide (Ta2O5), Zirconium oxide (ZrO2), Titanium oxide (TiO2), strontium titanium oxide (SrTiO3), or another high-k dielectric material, among others. In some embodiments, the gate dielectric layer is formed by atomic layer deposition, and can have a thickness ranging between 1 nm and 3 nm.

Figure 14:
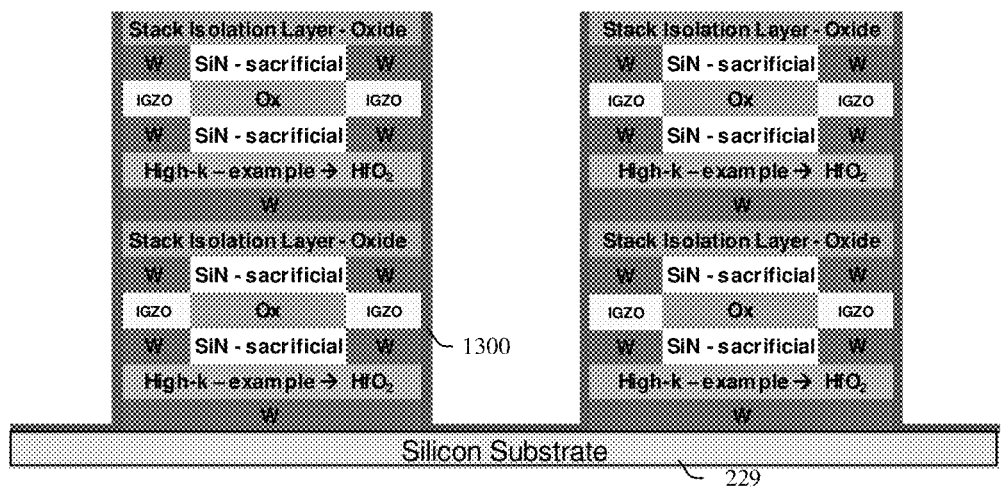

In FIG. 14, a CMP operation is carried out to remove the high-k gate dielectric from over top the memory stacks.

Figure 15:
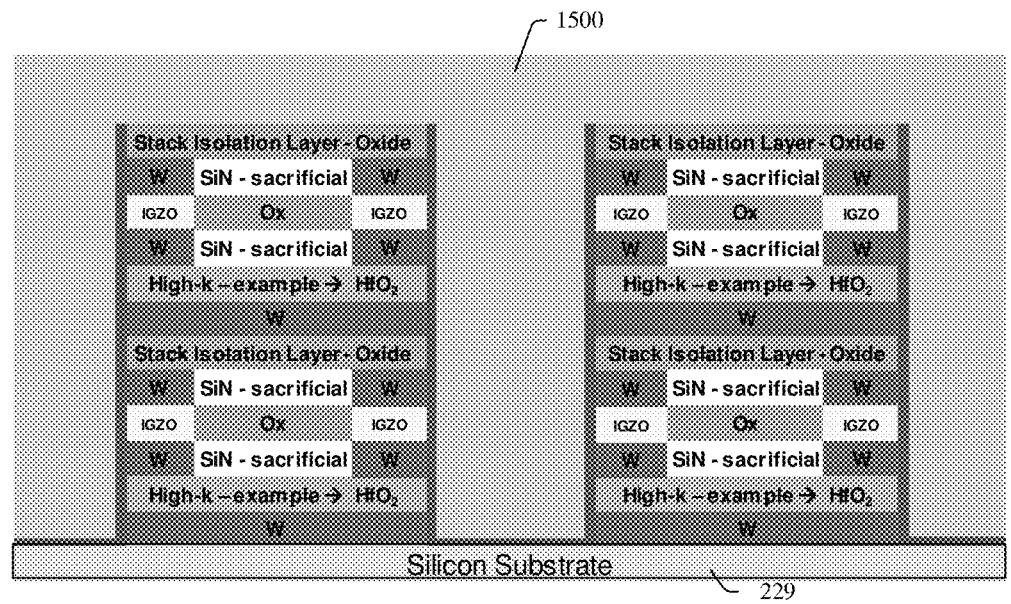

In FIG. 15, a conductive wordline material 1500, such as a metal, is deposited to fill in the trenches between the patterned columns of memory stack structures, and thereby establish wordlines. In some embodiments, the conductive wordline material 1500 is formed by a physical deposition process, such as sputtering, electroplating, atomic layer deposition, or physical vapor deposition. In some embodiments, the conductive wordline material 1500 comprises copper (Cu), aluminum, and/or tungsten (W), among others. In some embodiments, the wordlines each have a thickness as measured on a normal line between nearest outer sidewalls of neighboring memory stacks, with the thickness ranging between 10 nm and 30 nm.

Figure 16:
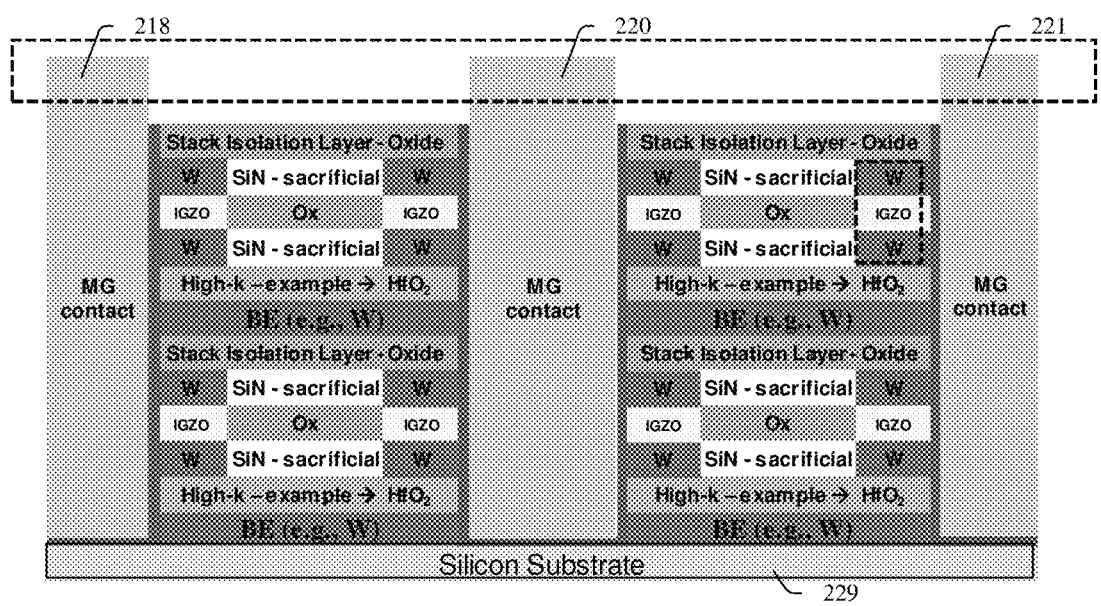

In FIG. 16, a CMP operation is carried out to remove the conductive wordline material from over top the memory stacks. By removing the conductive wordline material, the CMP operation also separates the conductive wordlines from one another, such that the conductive wordlines 218, 220, 221 are isolated from one another to carry distinct wordline signals during operation.

Figure 17:
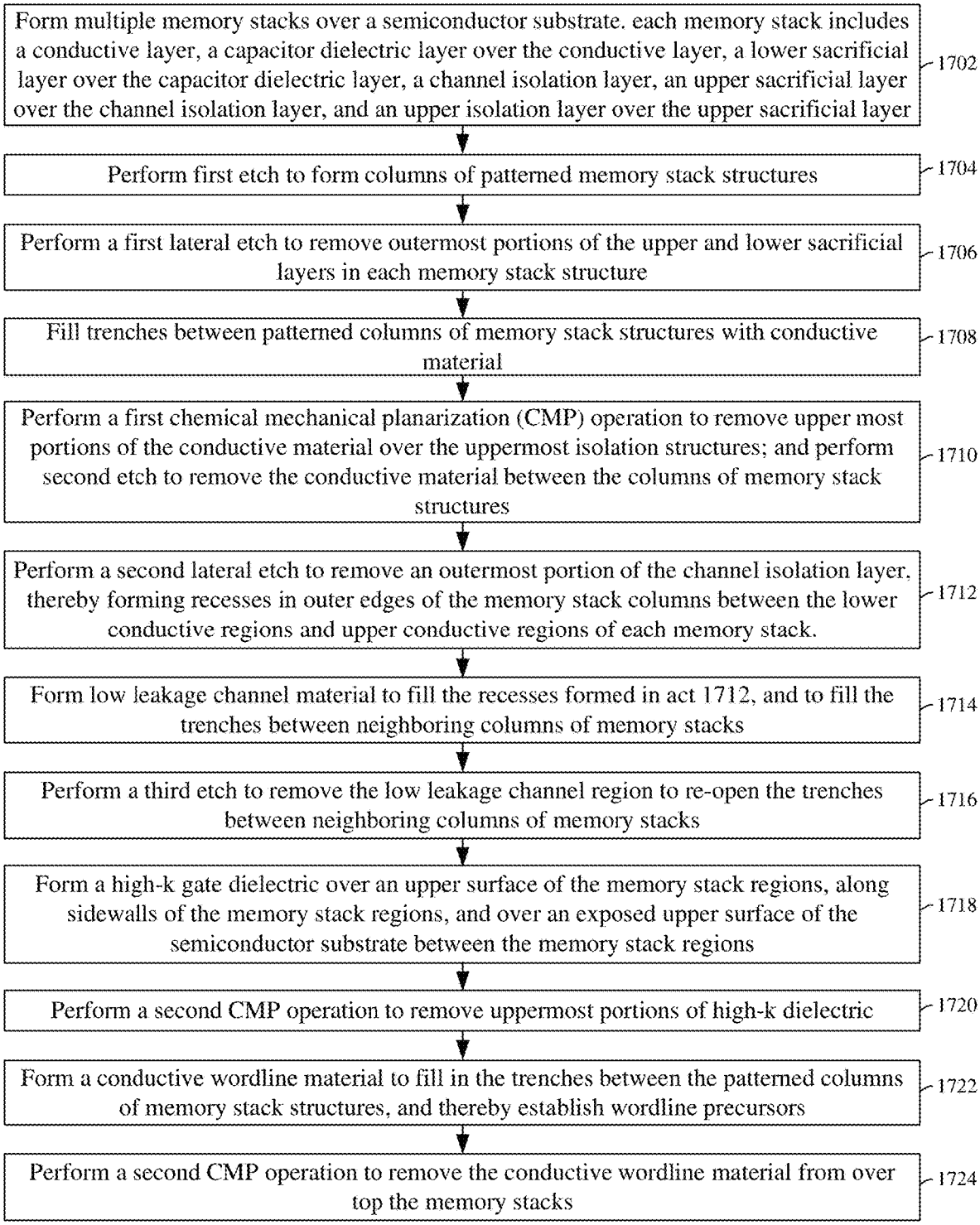
FIG. 17 depicts a flow chart that depicts a manufacturing flow in accordance with some embodiments.

FIG. 17 illustrates a methodology 1700 of forming a DRAM device in accordance with some embodiments. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

In act 1702, multiple memory stacks are formed over a semiconductor substrate. Each memory stack includes a conductive layer, a capacitor dielectric layer over the conductive layer, a lower sacrificial layer over the capacitor dielectric layer, a channel isolation layer, an upper sacrificial layer over the channel isolation layer, and an upper isolation layer over the upper sacrificial layer. Thus, some embodiments of act 1702 correspond, for example to FIG. 5.

In act 1704, wet or dry etch is carried out with to form columns of patterned memory stack structures. Thus, some embodiments of act 1704 correspond, for example to FIG. 6.

In act 1706, a first lateral etch is performed to remove outermost portions of the upper and lower sacrificial layers in each memory stack structure, thereby forming recesses 702 in sidewalls of the patterned memory stack structures. Thus, some embodiments of act 1706 correspond, for example to FIG. 7.

In act 1708, trenches between patterned columns of memory stack structures are filled with conductive material. Thus, some embodiments of act 1708 correspond, for example to FIG. 8.

In act 1710, a first chemical mechanical planarization (CMP) operation is carried out to remove upper most portions of the conductive material over the uppermost isolation structures. A second etch is then performed to remove the conductive material between the columns of memory stack structures. Thus, some embodiments of act 1710 correspond, for example to FIG. 9.

In act 1712, a second lateral etch is performed to remove outermost portions of the channel isolation layer, thereby forming recesses in outer edges of the memory stack columns between the lower conductive regions and upper conductive regions of each memory stack. Thus, some embodiments of act 1712 correspond, for example to FIG. 10.

In act 1714, low-leakage channel material is formed to fill the recesses formed in act 1716, and to fill the trenches between neighboring columns of memory stacks. Thus, some embodiments of act 1714 correspond, for example to FIG. 11.

In act 1716, a third etch is performed to remove the low-leakage channel region to re-open the trenches between neighboring columns of memory stacks. Thus, some embodiments of act 1716 correspond, for example to FIG. 12.

In act 1718, a high-k gate dielectric is formed over an upper surface of the memory stack regions, along sidewalls of the memory stack regions, and over an exposed upper surface of the semiconductor substrate between the memory stack regions. Thus, some embodiments of act 1718 correspond, for example to FIG. 13.

In act 1720, a second CMP operation is performed to remove the high-k dielectric from over top the memory stacks. Thus, some embodiments of act 1720 correspond, for example to FIG. 14.

In act 1722, a conductive wordline material is formed to fill in the trenches between the patterned columns of memory stack structures, and thereby establish wordline precursors. Thus, some embodiments of act 1722 correspond, for example to FIG. 15.

In act 1724, a second CMP operation is performed to remove the conductive wordline material from over top the memory stacks, and thereby form separate or distinct wordlines between the memory stack columns. Thus, some embodiments of act 1724 correspond, for example to FIG. 16.

Thus, some embodiments relate to a semiconductor device. The semiconductor device includes a semiconductor substrate, and a pair of metal gates extend upward from the semiconductor substrate in parallel with one another. The metal gates have inner sidewalls that are spaced apart from one another. First and second channel regions are disposed between the inner sidewalls of the pair of metal gates. First and second drain regions are disposed between the inner sidewalls of the pair of metal gates and are disposed directly over the first and second channel regions, respectively. First and second source regions are disposed between the inner sidewalls of the pair of metal gates directly below the first and second channel regions, respectively. The first and second channel regions separate the first and second drain regions from the first and second source regions. A capacitor dielectric structure is disposed between the inner sidewalls of the pair of metal gates and is disposed below the first and second source regions. A bottom capacitor electrode is disposed between the inner sidewalls of the pair of metal gates and is disposed below the capacitor dielectric structure. The capacitor dielectric structure separates the first and second drain regions from the bottom capacitor electrode.

Some embodiments relate to a semiconductor device. The semiconductor device includes a semiconductor substrate, and a bottom capacitor electrode is disposed over the semiconductor substrate. A lower capacitor dielectric structure is disposed over the bottom capacitor electrode. First and second lower source regions are disposed over the lower capacitor dielectric structure and are spaced laterally apart from one another. A lower channel region is disposed directly over the first and second lower source regions. First and second lower drain regions are disposed directly over the lower channel region, wherein the lower channel region separates the first and second lower drain regions from the first and second lower source regions, respectively. A pair of gate dielectric regions extend upwards in a direction generally perpendicular to an upper surface of the semiconductor substrate and in parallel with one another. The pair of gate dielectric regions have inner sidewalls that laterally bound outer edges of the bottom capacitor electrode, that laterally bound outer edges of the first and second lower source regions, that laterally bound outer edges of the lower channel region, and that laterally bound outer edges of the first and second lower drain regions. A pair of metal gates extend upward in parallel with the pair of gate dielectric regions. The pair of metal gates have inner sidewalls that extend along outer sidewalls of the pair of gate dielectric regions, respectively.

Some embodiments relate to a method. In the method, multiple memory stacks are formed to be stacked over one another and to be stacked over a semiconductor substrate. Each memory stack includes a conductive layer, a capacitor dielectric layer over the conductive layer, a lower sacrificial layer over the capacitor dielectric layer, a channel isolation layer, an upper sacrificial layer over the channel isolation layer, and an upper isolation layer over the upper sacrificial layer. An etch is performed to pattern the memory stacks into multiple columns of memory stack structures, wherein trenches separate the multiple columns of memory stack structures from one another. A first lateral etch is performed to remove outermost portions of the upper sacrificial layer and outermost portions of the lower sacrificial layer in each column of memory stack structures, thereby forming first lower recesses and first upper recesses in sidewalls of the columns of memory stack structures. The trenches between the columns of memory stack structures, the first lower recesses, and the first upper recesses are filled with conductive material. A second etch is performed to remove the conductive material from the trenches between the columns of memory stack structures while leaving the conductive material to establish lower conductive regions in the first lower recesses and upper conductive regions in the first upper recesses. A second lateral etch is performed to remove outermost portions of the channel isolation layer to form second recesses in outer edges of the columns of memory stack structures between the lower conductive regions and upper conductive regions of each memory stack structure. Low-leakage channel material is formed in the trenches and in the second recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a first metal gate extending upward from the substrate;
   a first bottom capacitor electrode disposed along a sidewall of the first metal gate over the substrate;
   a lower capacitor dielectric structure disposed over the first bottom capacitor electrode; and
   a first lower source/drain region disposed directly over the lower capacitor dielectric structure;
   a first lower channel region disposed directly over the first lower source/drain region;
   a first lower drain/source region disposed directly over the first lower channel region;
   a second bottom capacitor electrode disposed along the sidewall of the first metal gate over the first lower drain/source region;
   an upper capacitor dielectric structure disposed over the second bottom capacitor electrode;
   a first upper source/drain region disposed directly over the second bottom capacitor electrode;
   a first upper channel region disposed directly over the first upper source/drain region; and
   a first upper drain/source region disposed directly over the first upper channel region.

2. The semiconductor device of claim 1, further comprising:
   a gate dielectric structure extending along the sidewall of the first metal gate and separating the first metal gate from the first lower channel region and from the first upper channel region.

3. The semiconductor device of claim 1, wherein the first metal gate extends continuously from the first bottom capacitor electrode to the first upper drain/source region.

4. The semiconductor device of claim 3, further comprising:
   a gate dielectric structure extending continuously along the sidewall of the first metal gate and separating the first metal gate from the first lower channel region and from the first upper channel region.

5. The semiconductor device of claim 1, further comprising:
   a second metal gate extending upward from the substrate in parallel with the first metal gate; and
   wherein the first bottom capacitor electrode and the lower capacitor dielectric structure each extends laterally between the first metal gate and the second metal gate.

6. The semiconductor device of claim 5, further comprising:
   a second lower source/drain region disposed directly over the lower capacitor dielectric structure and along a sidewall of the second metal gate, the second lower source/drain region spaced apart laterally from the first lower source/drain region;
   a second lower channel region disposed directly over the second lower source/drain region; and
   a second lower drain/source region disposed directly over the second lower channel region.

7. The semiconductor device of claim 6, wherein the second bottom capacitor electrode and the upper capacitor dielectric structure each extends laterally between the first metal gate and the second metal gate, and further comprising:
   a second upper source/drain region disposed directly over the second bottom capacitor electrode and along the sidewall of the second metal gate, the second upper source/drain region spaced laterally apart from the first upper source/drain region;
   a second upper channel region disposed directly over the second upper source/drain region; and
   a second upper drain/source region disposed directly over the second upper channel region.

8. A semiconductor device, comprising:
   a substrate;
   a first metal gate extending upward in a direction generally perpendicular to an upper surface of the substrate;
   a first gate dielectric extending along an inner sidewall of the first metal gate;
   a bottom capacitor electrode disposed over the substrate;
   a capacitor dielectric structure disposed over the bottom capacitor electrode and along an inner sidewall of the first gate dielectric;
   a first source/drain region disposed over the capacitor dielectric structure and along the inner sidewall of the first gate dielectric;
   a first channel region disposed directly over the first source/drain region and along the inner sidewall of the first gate dielectric; and
   a second source/drain region directly over the first channel region and along the inner sidewall of the first gate dielectric, wherein the first channel region separates the first source/drain region from the second source/drain region.

9. The semiconductor device of claim 8, wherein the first metal gate and the first gate dielectric extend continuously from a first height corresponding to the bottom capacitor electrode to a second height corresponding to the second source/drain region.

10. The semiconductor device of claim 8, further comprising:
    a second metal gate extending upward from the substrate in parallel with the first metal gate and spaced apart laterally from the first metal gate, a second gate dielectric extending along an inner sidewall of the second metal gate, such that the bottom capacitor electrode and the capacitor dielectric structure extend laterally between the first gate dielectric and the second gate dielectric.

11. The semiconductor device of claim 10, further comprising a third source/drain region disposed over the capacitor dielectric structure, the third source/drain region being disposed at a height corresponding to the first source/drain region;
    a second channel region disposed directly over the third source/drain region; and
    a fourth source/drain region directly over the second channel region, wherein the second channel region separates the third source/drain region from the fourth source/drain region.

12. The semiconductor device of claim 11, wherein the first channel region and the second channel region correspond to a single body of oxide semiconductor material.

13. The semiconductor device of claim 12, further comprising:
    an oxide region arranged laterally between the first channel region and the second channel region, such that the first channel region and the second channel region are separate regions of oxide semiconductor material.

14. A semiconductor device, comprising:
a substrate;
a bottom capacitor electrode disposed over the substrate;
a first transistor structure disposed over the bottom capacitor electrode, the first transistor structure comprising a first upper doped region and a first lower doped region which have a first conductivity type and a first middle doped region having a second conductivity type opposite the first conductivity type, the first middle doped region separating the first upper doped region from the first lower doped region; and
a first capacitor dielectric structure disposed over the bottom capacitor electrode and separating the bottom capacitor electrode from the first lower doped region of the first transistor structure;
a dielectric isolation region disposed over the first transistor structure;
an upper capacitor electrode disposed over the dielectric isolation region;
a second transistor structure disposed over the upper capacitor electrode, the second transistor structure comprising a second upper doped region and a second lower doped region which have the first conductivity type and a second middle doped region having the second conductivity type, the second middle doped region separating the second upper doped region from the second lower doped region; and
a second capacitor dielectric structure disposed over the upper capacitor electrode and separating the upper capacitor electrode from the second lower doped region of the second transistor structure.

15. The semiconductor device of claim 14, wherein the bottom capacitor electrode comprises copper.

16. The semiconductor device of claim 14, further comprising:
a second transistor structure disposed over the bottom capacitor electrode, the second transistor structure comprising a second upper doped region and a second lower doped region which have the first conductivity type and a second middle doped region having the second conductivity type, the second middle doped region separating the second upper doped region from the second lower doped region; and
wherein the first capacitor dielectric structure separates the bottom capacitor electrode from the second lower doped region of the second transistor structure.

17. The semiconductor device of claim 16, wherein the first lower doped region and the second lower doped region are each arranged at a first height over the substrate, and wherein the first upper doped region and the second upper doped region are each arranged at a second height over the substrate, the second height being greater than the first height.

18. The semiconductor device of claim 14, further comprising:
a first metal gate extending in a direction perpendicular to an upper surface of the substrate; and
a first gate dielectric extending along a sidewall of the first metal gate, wherein the first gate dielectric separates the first metal gate from each of the bottom capacitor electrode, the first lower doped region, the first middle doped region, and the first upper doped region.

19. The semiconductor device of claim 18, further comprising:
a second metal gate extending upward from the substrate in parallel with the first metal gate and spaced apart laterally from the first metal gate; and
a second gate dielectric extending along an inner sidewall of the second metal gate, such that the bottom capacitor electrode and the first capacitor dielectric structure extend laterally between the first gate dielectric and the second gate dielectric.

20. The semiconductor device of claim 19, further comprising
a second lower doped region disposed over the first capacitor dielectric structure, the second lower doped region being disposed at a height corresponding to the first lower doped region and having the first conductivity type;
a second middle doped region disposed directly over the second lower doped region, the second middle doped region having the second conductivity type; and
a second upper doped region directly over the second middle doped region and having the first conductivity type, wherein the second middle doped region separates the second lower doped region from the second upper doped region.

* * * * *